(12) United States Patent
Marsh et al.

(10) Patent No.: US 9,172,118 B2
(45) Date of Patent: Oct. 27, 2015

(54) METHOD AND SYSTEM FOR ESTIMATING BATTERY LIFE

(75) Inventors: Richard A. Marsh, Beverly Hills, MI (US); Carol L. Johnson, Rochester Hills, MI (US); Andrew H. Leutheuser, Royal Oak, MI (US); Shyh-Yeu Jao, Bloomfield Hills, MI (US)

(73) Assignee: GM GLOBAL TECHNOLOGY OPERATIONS, LLC., Detroit, MI (US)

( * ) Notice: Subject to any disclaimer, the term of this patent is extended or adjusted under 35 U.S.C. 154(b) by 1593 days.

(21) Appl. No.: 12/486,631

(22) Filed: Jun. 17, 2009

(65) Prior Publication Data

US 2010/0324846 A1 Dec. 23, 2010

(51) Int. Cl.
| | | |
|---|---|---|
| *G01R 31/36* | (2006.01) | |
| *H01M 10/48* | (2006.01) | |
| *B60L 3/00* | (2006.01) | |
| *B60L 3/12* | (2006.01) | |
| *B60L 11/14* | (2006.01) | |
| *B60L 11/18* | (2006.01) | |

(52) U.S. Cl.
CPC ............ *H01M 10/48* (2013.01); *B60L 3/0061* (2013.01); *B60L 3/12* (2013.01); *B60L 11/14* (2013.01); *B60L 11/1857* (2013.01); *B60L 11/1861* (2013.01); *G01R 31/3679* (2013.01); *B60L 2210/40* (2013.01); *B60L 2240/36* (2013.01); *B60L 2240/545* (2013.01); *B60L 2240/547* (2013.01); *B60L 2240/549* (2013.01); *B60L 2250/16* (2013.01); *B60L 2260/44* (2013.01); *Y02T 10/70* (2013.01); *Y02T 10/7005* (2013.01); *Y02T 10/705* (2013.01); *Y02T 10/7044* (2013.01); *Y02T 10/7077* (2013.01); *Y02T 10/7241* (2013.01)

(58) Field of Classification Search
CPC .............. G01R 31/36; G01R 31/3606; G01R 31/3624; G01R 31/3627
USPC .......................................................... 702/63
See application file for complete search history.

(56) References Cited

U.S. PATENT DOCUMENTS

| | | | | |
|---|---|---|---|---|
| 5,658,682 | A | * | 8/1997 | Usuda et al. ..................... 429/92 |
| 6,583,606 | B2 | * | 6/2003 | Koike et al. ..................... 320/149 |
| 7,880,597 | B2 | * | 2/2011 | Uchida ........................ 340/439 |
| 2005/0017685 | A1 | * | 1/2005 | Rees et al. ..................... 320/132 |
| 2006/0232240 | A1 | * | 10/2006 | Salasoo et al. ................ 320/119 |
| 2006/0232277 | A1 | * | 10/2006 | Murakami et al. ............ 324/433 |
| 2007/0285061 | A1 | * | 12/2007 | Zettel et al. ................... 320/132 |
| 2008/0094035 | A1 | * | 4/2008 | Plett ............................. 320/136 |
| 2009/0040033 | A1 | * | 2/2009 | Uchida ........................ 340/439 |
| 2010/0138178 | A1 | * | 6/2010 | Paryani et al. .................. 702/63 |

FOREIGN PATENT DOCUMENTS

EP            501952 B1  *  10/1996

* cited by examiner

*Primary Examiner* — Timothy Thompson
*Assistant Examiner* — Rhadames J Alonzo Miller
(74) *Attorney, Agent, or Firm* — Ingrassia Fisher & Lorenz, P.C.

(57) ABSTRACT

Methods and systems for estimating remaining life of an automotive propulsion battery are provided. A total usable capacity of the battery is calculated based on cycling the battery. A first component of degradation is calculated based on driving throughput of the battery. A second component of degradation is calculated based on aging of the battery. The total degradation is calculated based on the sum of the first component and the second component of degradation.

20 Claims, 3 Drawing Sheets

METHOD AND SYSTEM FOR ESTIMATING BATTERY LIFE

TECHNICAL FIELD

The present invention generally relates to vehicular electrical systems, and more particularly relates to a method and system for estimating the useful life of a battery, such as one used in electric vehicles (EVs) and hybrid electric vehicle (HEVs).

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel vehicles, such as hybrid, battery electric, and fuel cell vehicles. Such alternative fuel vehicles typically use one or more electric motors, perhaps in combination with another actuator, to drive the wheels. With recent fluctuations in fossil fuel prices, it is now more desirable than ever to power automobiles with electric power, as with electric and hybrid electric vehicles (EVs and HEVs).

Regulatory authorities have mandated that such vehicles provide an indication to the customer that the battery used to drive the electric motor(s) has reached its "end of life," (no useful life remaining) such as when the range of the vehicle has decreased to 75% of its range when the vehicle was new and/or the capacity of the battery has degraded to 75% of its initial capacity (for example). If the battery reaches its end of life prior to the end of the warranty period provided (e.g., 10 years/150,000 miles for an Advanced Technology Partial Zero Emissions Vehicle (AT-PZEV)), it will be replaced under warranty.

Accordingly, it is desirable to provide a reliable and accurate method for estimating or calculating the remaining useful life of the battery. Furthermore, other desirable features and characteristics of the present invention will become apparent from the subsequent description taken in conjunction with the foregoing technical field and background.

SUMMARY OF THE INVENTION

In one embodiment, a method for estimating remaining life of an automotive propulsion battery is provided. A total usable capacity of the battery is calculated based on cycling the battery. A first component of degradation is calculated based on driving throughput of the battery. A second component of degradation is calculated based on aging of the battery. The total degradation is calculated based on the sum of the first component and the second component of degradation. The remaining life of the battery is estimated based on the total usable capacity and the first and second components of degradation. An indication of the remaining life is provided to a user.

In another embodiment, a method for estimating the remaining life of an automotive propulsion battery is provided. A total useable capacity of the battery is calculated based on cycling of the battery. A first component of degradation is calculated based on the driving throughput of the battery. The calculating of the first component of degradation includes calculating the driving throughput of the battery used to operate the vehicle on at least one predetermined driving schedule. A second component of degradation is calculated based on aging of the battery. The calculating of the second component of degradation includes determining a rate of degradation based on results of tests performed on the battery. The remaining life of the battery is estimated based on the total useable capacity and the first and second components of degradation. An indication of the degradation is provided to a user.

In a further embodiment, a machine-readable medium is provided. The machine-readable medium has a set of instructions stored thereon that when performed by a machine causes the machine to perform a method. The method includes calculating a total useable capacity of a battery, calculating a first component of degradation based on the driving throughput of the battery, calculating a second component of degradation based on aging of the battery, estimating a remaining life of the battery based on the total useable capacity and the first and second components of degradation, and providing an indication of the remaining life to a user.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Figure 1:
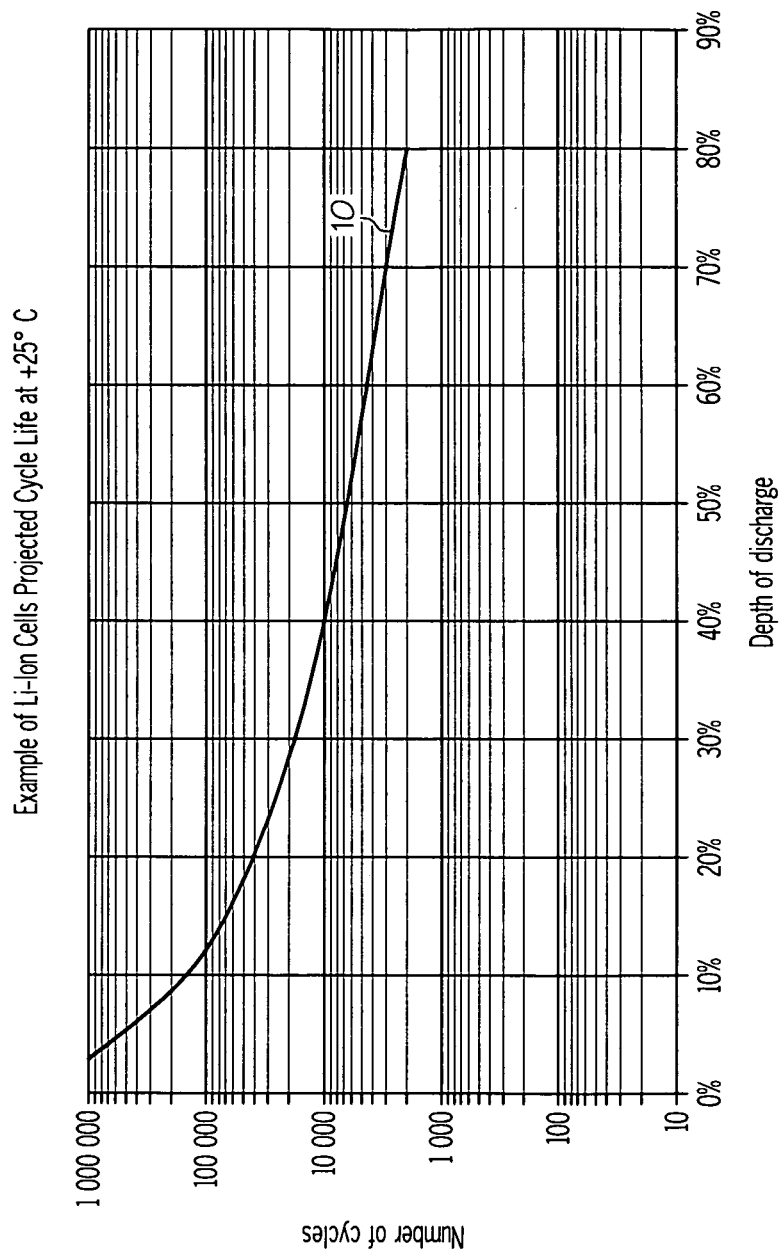
FIG. 1 is a graph comparing the depth of discharge of an exemplary battery to the number of cycles within particular life span of the battery.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-3 are merely illustrative and may not be drawn to scale.

Figure 2:
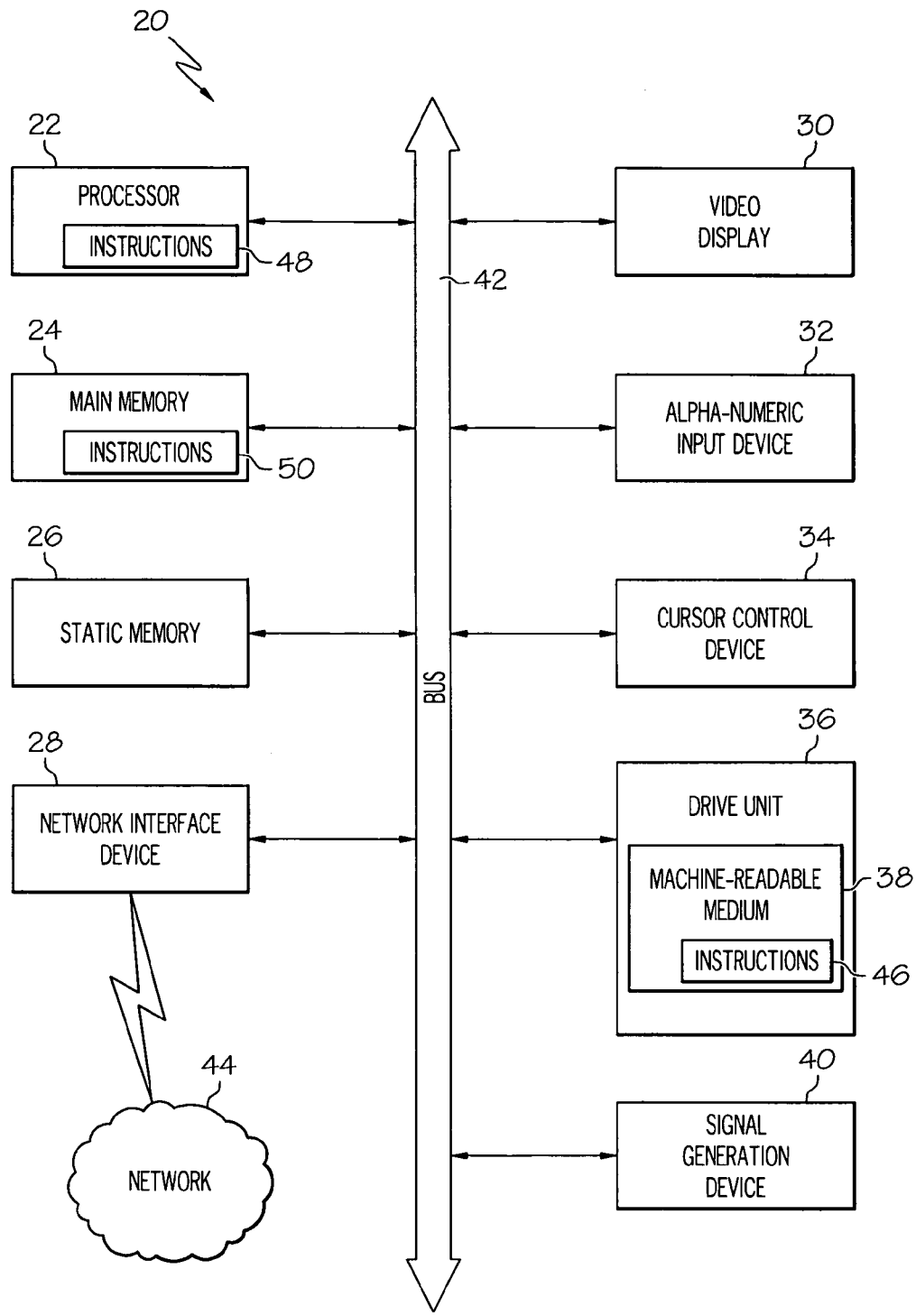
FIG. 2 is a block diagram of an exemplary computing system.
Figure 3:
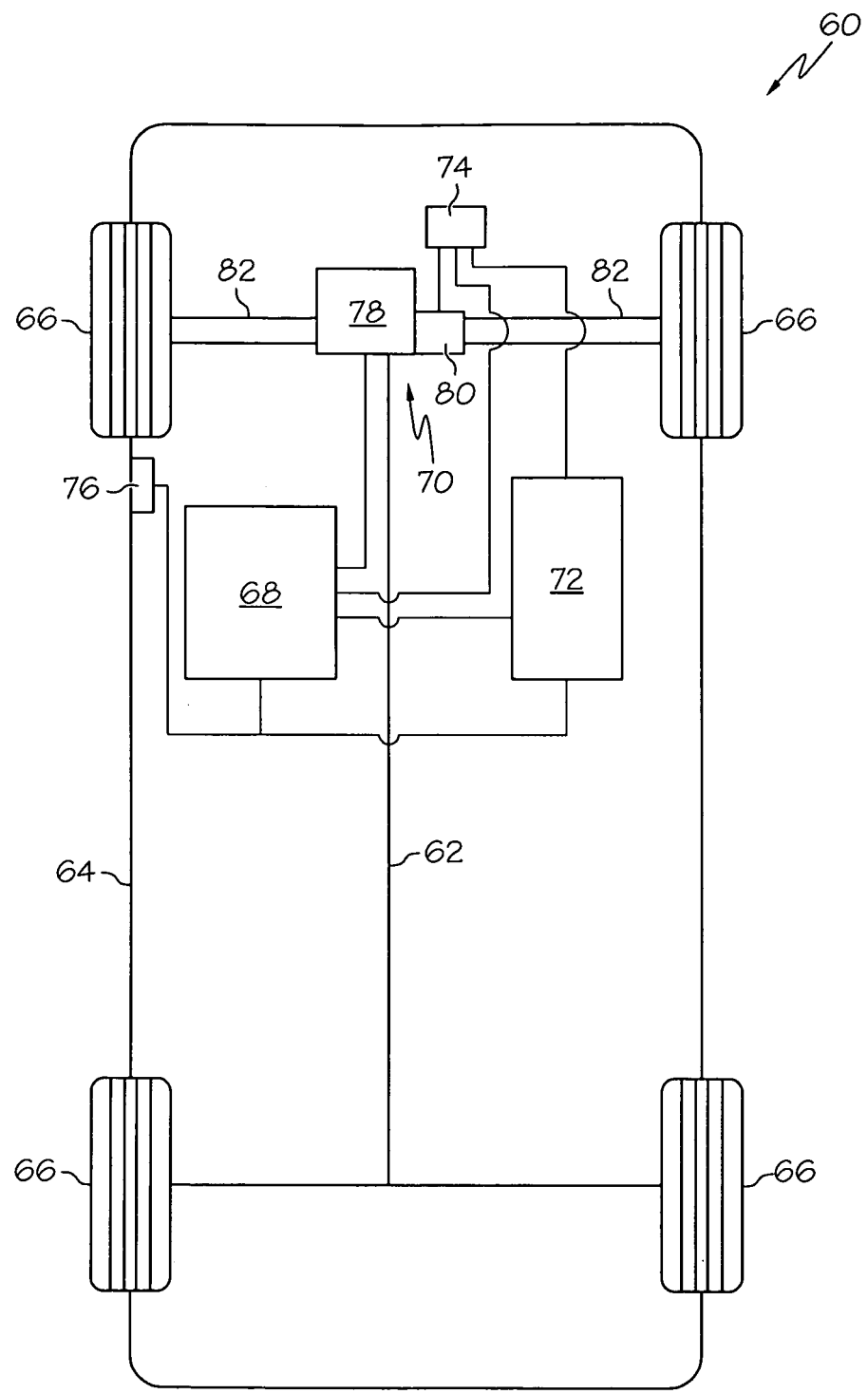
FIG. 3 is a schematic view of an exemplary automobile.

FIG. 2 and FIG. 3 illustrate methods and systems for estimating the remaining life (and/or degradation) of an automotive propulsion battery. In one embodiment, the "End of Life" (or Remaining Life) of a battery is determined by several steps.

First, the "Total Usable Capacity" of the battery in its intended application is calculated. This is done by determining the throughput necessary to degrade from new to, for example, 75% capacity (i.e., the capacity remaining when the vehicle reaches the point where it can only attain 75% of its original range). This allows the calculation of the capacity available to be degraded during vehicle operation (e.g., driving the vehicle, or cycling, and while parked), which may be referred to as the "Total Usable Capacity." Second, the total degradation of the battery is determined from the sum of the degradation caused by driving the vehicle (i.e., a first component of degradation) and the degradation caused by the vehicle being parked (i.e., a second component of degradation). Third, the remaining life of the battery is calculated by subtracting the total degradation from the "Total Usable Capacity" of the battery.

Generally, degradation of battery capacity is generally caused by battery "cycling" and aging. Battery cycling (or just "cycling") refers to the input and output of energy from the battery (i.e., charging and discharging) and causes loss of capability as a function of the amount of energy removed from the battery and the conditions under which the energy was removed. Aging (i.e., stand time or calendar life) causes loss of capability at a rate determined by the temperature and State of Charge (SOC) at which the battery stands idle (i.e., when the vehicle is not being driven). The degradation of the total capacity of a battery over the lifetime of the battery may be simplified as the sum of the capacity loss due to cycling and the capacity loss due to aging.

It should be noted that the throughput necessary to degrade the battery's capacity to 80% is determined by standard battery performance testing. This throughput to degrade the battery from 100% to 80% capacity must be adjusted to determine the throughput required to degrade the battery from 100% (new) to 75% (End of Life) capacity. This throughput is called the Total Usable Capacity and may be referred to as "one life" of the battery. Throughput is specified in MWh (megawatt hours). Other End of Life capacities may be chosen in the future by different regulatory bodies.

With respect to cycling (or the first component of degradation), "Total Usable Capacity" (one life) of the battery at 80% capacity may be defined as the loss of capacity that reduces the battery from a first capacity (e.g., 100% capacity) to a second capacity (e.g., 80% capacity) as a result of cycling throughput. The throughput (i.e., kWh) required to reduce the battery capacity to, for example, 80% may be determined from a curve that specifies the number of cycles within a life of an exemplary lithium ion battery as a function of depth of discharge (DoD). An example of such a curve (or line) 10, is shown in FIG. 1. The curve shown is based on a battery cell temperature of 25° C. Thus, as described below, throughput that occurs at different conditions (i.e., DoD or temperature) may be normalized to the particular depth of discharge and temperature of the particular battery in question. This total available capacity (at 80% capacity) must be adjusted to the correct regulatory End of Life Degradation, for example 75%, prior to calculating remaining life.

With respect to aging (or the second component of degradation), "one life" may be defined as the loss of capacity (i.e., from the first capacity to the second capacity) as a result of the battery standing idle (vehicle not driving) at a given State of Charge (SOC) and cell temperature. The rate of capacity loss is measured in time to degrade the battery capacity from 100% to 80% and is specified in years. It should be noted that although a battery may seem to retain a sufficiently high capacity for the duration in question (e.g., 10 years), it should not be assumed that the battery will last beyond 10 or 15 years as there are other mechanisms that become evident after 10 years.

In one exemplary embodiment, the curve 10 in FIG. 1 is used to determine the throughput required by specifying the desired DoD and finding the resultant number of cycles to degrade the batteries capacity to 80%. In the example shown, at 50% DoD, the number of cycles to 80% capacity is 6000.

The throughput for one cycle on the curve is determined by multiplying the battery capacity (in kWh) by the DoD (in decimal). This is the output energy in kWh. In one embodiment, the battery capacity is 16 kWh. Total throughput required to degrade the battery to 80% is the throughput (i.e., output only or output plus input) for one cycle multiplied by the number of cycles.

Thus, for a battery with 16 kWh capacity that will be reduced to 80% of that capacity after 6000 cycles at 25° C. and 50% DoD, one life of throughput, for output only, will be 48 MWh (i.e., 16 kWh·0.50·6000).

It should be noted that the calculation above was based on a specific DoD and cell temperature. However, because driving cycles, charging habits and temperatures (i.e., ambient and cell temperatures) may vary from the standard of 25° C. and 50% DoD selected in FIG. 1, correction factors may be used to normalize the actual throughput (i.e., adjust the degradation effect) to the equivalent degradation that would occur at the temperature and DoD the particular graph used (e.g., 25° C. and 50% DoD). These correction factors may be used without interpolation. Table 1 lists several such correction factors.

TABLE 1

|  | DoD | | |
| --- | --- | --- | --- |
| Bat temp | 50% | 30% | 10% |
| 35° C. | 2 | 1.2 | 1 |
| 25° C. | 1 | .6 | .5 |

In Table 1, the 50% DoD column represents operation to full "discharge" before recharging. The 30% and 10% DoD columns represent operation with recharge prior to reaching full discharge.

In the exemplary table shown, the temperature rows are based on the assumption that the battery will not be operated with cell temperatures greater than 40° C., and there is no "credit" for operation with cell temperatures below 20° C. It should be understood that the data ranges provided in Table 1 are merely exemplary and other correction factors may be developed for temperatures above 35° C. and below 25° C., as well as state of charge swings greater than 50% DoD.

Regarding aging, Table 2 lists derived rates of degradation of a battery due to aging listed according to the temperature and the State of Charge (SOC) at which the battery is stored. The battery rate of degradation listed (i.e., in years) demonstrated the time until the battery degrades to 80% capacity.

TABLE 2

|  | Temp | | | | | |
| --- | --- | --- | --- | --- | --- | --- |
| SOC | 0° C. | 25° C. | 40° C. | 50° C. | 65° C. | 80° C. |
| 100% | 10 | 5 | 1 | 1 | | |
| 80% | 24 | 12 | 3 | 2 | | |

TABLE 2-continued

| SOC | 0° C. | 25° C. | 40° C. | 50° C. | 65° C. | 80° C. |
|---|---|---|---|---|---|---|
| 75% | 32 | 16 | 4 | 3 | | |
| 60% | 70 | 35 | 10 | 6 | 2 | |
| 50% | 110 | 55 | 18 | 11 | | |
| 25% | 120 | 61 | 50 | 30 | | |
| 0% | | | | | | |

As will be appreciated by one skilled in the art, the information displayed in Tables 1 and 2 may be derived from specific battery test data. As such, it should be understood that the information listed is merely exemplary and may vary depending on the particular battery used. It should further be noted that more comprehensive tables, similar to Table 2, may be generated which include additional columns for other temperatures (e.g., 15° C.). Other such tables may also be generated to reduce the second component of degradation, as will be appreciated by one skilled in the art, by setting maximum limits for the state of charge of the battery based on the cell temperature.

With respect to aging, capacity degradation in portion of "one life" (total usable capacity) may be expressed as the ratio of the required usage in years to the projected time to degrade to 80% capacity. For example, if the required life is 10 years (e.g., an emission warranty), and the projected time to degrade to 80% capacity at 25° C. and 60% SOC is 35 years (from Table 2), the percentage of the "one life" that is consumed from aging is 29% (i.e., 10/35).

Referring again to the exemplary battery with 48 MWh of throughput cycling for one life, the battery life estimation may be performed as follows. As an example, it may be assumed that the battery will be driven on a schedule that includes three portions: 50% DoD cycles driving at 25° C. for 10 MWh of measured output, 50% DoD cycles driving at 35° C. for 8 MWh of measured, unadjusted output, and 10% DoD cycles driving at 25° C. for 6 MWh of measured, unadjusted output.

Using Table 1, the 50% DoD cycles output at 35° C. (i.e., 8 MWh) may then be normalized by applying the appropriate correction factor (i.e., 2) such that the normalized output becomes 16 MWh (i.e., 8×2). In a similar manner, the 10% DoD cycling output at 25° C. (i.e., 6 MWh) becomes 3 MWh (i.e., 6×0.5), also using the appropriate correction factor from Table 1. Thus, for the given example, the total cycling (or driving) output (or the first battery life component) is 29 MWh (i.e., 10+16+3), which is 60% of the 48 MWh "one life" of output cycling (i.e., 29/48).

Using the aging degradation (or the second battery life component) example from above which consumed 29% of "one life," the total degradation from this schedule of operation would be 89% of "one life" (i.e., 60%+29%). That is, using the driving schedule discussed above, the exemplary battery would be capable of fulfilling the warranty period (e.g., 10 years).

In comparison, a battery that consumed, for example, 80% of "one life" from cycling and 70% of "one life" from aging, resulting from either different performance characteristics and/or a different driving schedule, would experience a total degradation of 150% of "one life." That is, such a battery may have to be replaced once during the warranty period.

Upon completion of the battery life estimation, an indication of the result may then be generated and provided to a user via a display screen, for example. The indication may simply indicate that the particular battery will (or will not) sustain a suitable capacity for the duration in question. Alternatively, the indication may include a specific time frame after which the capacity of the battery will decline below the "one life" limit as described above.

One advantage is that because of the accounting for the aging, or stand time, of the battery, the accuracy of the battery life estimation is improved. Another advantage is that because of the correction factors applied to the throughput of the battery at particular temperatures and depths of discharge, accuracy is even further improved.

FIGS. 2 and 3 illustrate systems in which the methods and systems describe above may be implemented. It should be understood though that the systems described below are merely intended as exemplary, as other types of computing systems and vehicles, as well as other systems including machine-readable media, may be used.

FIG. 2 schematically illustrates an exemplary computing system 20 which may be used to implement the systems and methods described above. The computing system 20 includes a processor 22, a main memory 24, a static memory 26, a network interface device 28, a video display 30, an alpha-numeric input device 32, a cursor control device 34, a drive unit 36 including a machine-readable medium 38, and a signal generation device 40. All of the components of the computing system 20 are interconnected by a bus 42. The computing system 20 may be connected to a network 44 through the network interface device 28.

The processor 22 may be any one of numerous known general-purpose microprocessors or an application specific processor that operates in response to program instructions. The processor 22 may be implemented using a plurality of digital controls, including field programmable gate arrays (FPGAs), application specific integrated circuits (ASICs), discrete logic, microprocessors, microcontrollers, and digital signal processors (DSPs), or combinations thereof.

The machine-readable medium 38 includes a set of instructions 46, which may be partially transferred to the processor 22 and the main memory 24 through the bus 42. The processor 22 and the main memory 24 may also have separate internal sets of instructions 48 and 50 stored thereon. The various sets of instructions 46, 48, and 50 may include instructions that cause the processor 22 to perform the method(s) described above. The main memory 24, static memory 26, the machine-readable medium 38, and/or the instructions 48 and 50 may include random access memory (RAM) and read-only memory (ROM), which may include the various information described above related to batteries. It will be appreciated that this is merely exemplary of one scheme for storing operating system software and software routines, and that various other storage schemes may be implemented.

The video display (or display device) 30 may be, for example, a liquid crystal display (LCD) device or a cathode ray tube (CRT) monitor. The alpha-numeric input device 32 may be a keyboard and the cursor control device 34 may be a mouse, as commonly understood.

FIG. 3 illustrates a vehicle (or "automobile") 60, according to one embodiment of the present invention. The vehicle 60 includes a chassis 62, a body 64, four wheels 66 (although other embodiments may have two or three wheels), and an electronic control system 68. The body 64 is arranged on the chassis 62 and substantially encloses the other components of the vehicle 60. The body 64 and the chassis 62 may jointly form a frame. The wheels 66 are each rotationally coupled to the chassis 62 near a respective corner of the body 64.

The vehicle 60 may be any one of a number of different types of automobiles, such as, for example, a sedan, a wagon, a truck, or a sport utility vehicle (SUV), and may be twowheel drive (2WD) (i.e., rear-wheel drive or front-wheel drive), four-wheel drive (4WD), or all-wheel drive (AWD). The vehicle 60 may also incorporate any one of, or combination of, a number of different types of engines, such as, for example, a liquid-fueled internal combustion engine, a gaseous compound (e.g., hydrogen and/or natural gas) fueled engine, a combustion/electric motor hybrid engine, and an electric motor.

Examples of fuels that may be used for combustion engines intended to be included within the scope of this invention include gasoline, diesel, "flex fuel" (i.e., a mixture of gasoline and alcohol), methanol, methyl tetrahydrofuran mixtures, various biodiesels, and liquefied petroleum gas (LPG). It should also be understood that the combustion engines may be either internal combustion engines or external combustion engines (e.g., a Carnot heat engine).

In the exemplary embodiment illustrated in FIG. 3, the vehicle 60 is a plug-in hybrid electric vehicle (or plug-in hybrid vehicle), and further includes an actuator assembly 70, a battery system (or battery) 72, a power converter assembly (e.g., an inverter assembly) 74, and a battery charge port 76. The actuator assembly 70 includes an internal combustion engine 78 and an electric motor/generator (or motor) 80.

As will be appreciated by one skilled in the art, the electric motor 80 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 80 may include multiple electromagnetic poles (e.g., sixteen poles), as is commonly understood.

Still referring to FIG. 3, in one embodiment, the combustion engine 78 and the electric motor 80 are integrated such that both are mechanically coupled to at least some of the wheels 16 through one or more drive shafts 82.

Although not shown, the battery system (or direct current (DC) power supply or electrical energy storage device source) 72 may include a 12V, lead-acid starter-lighting-ignition (SLI) battery, as well as a high voltage battery suitable for powering the electric motor 80 (e.g., a lithium ion battery).

Although not shown in detail, in one embodiment, the inverter 74 includes a three-phase circuit coupled to the motor 80. More specifically, the inverter 74 includes a switch network having a first input coupled to a voltage source Vdc (e.g., the battery 72) and an output coupled to the motor 80. The switch network comprises three pairs (a, b, and c) of series switches with antiparallel diodes (i.e., antiparallel to each switch) corresponding to each of the phases of the motor 80. As is commonly understood, each of the switches may be in the form of individual semiconductor devices such as insulated gate bipolar transistors (IGBTs) within integrated circuits formed on semiconductor (e.g. silicon) substrates (e.g., die).

The electronic control system 68 is in operable communication with the actuator assembly 70, the battery 72, the inverter assembly 74, and the charge port 26. Although not shown in detail, the electronic control system 68 includes various sensors and automotive control modules, or electronic control units (ECUs) or modules (ECMs), such as an inverter control module and a vehicle controller, and at least one processor and/or a memory which may include instructions stored thereon (or in another computer-readable medium) for carrying out the processes and methods as described above.

As described above, the automobile shown in the drawings and described above is merely intended as one example of a vehicle in which the charge receptacle may be used. It should be noted that the charge receptacle may also be used in other types of land vehicles, such as motorcycles and personal transportation devices, as well as other categories of vehicles, such as watercraft and aircraft.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for estimating remaining life of an automotive propulsion battery comprising:
    calculating a total usable capacity of the battery based on cycling the battery via a processor;
    calculating a first component of degradation based on driving throughput of the battery via the processor;
    calculating a second component of degradation based on a calendar life of the battery via the processor;
    calculating the total degradation based on the sum of the first component and the second component of degradation via the processor;
    estimating the remaining life of the battery beyond a current battery cycle based on the total usable capacity and the first and second components of degradation via the processor; and
    providing an indication of the remaining life to a user.

2. The method of claim 1, wherein the calculating of the first component of degradation comprises calculating the battery throughput used to operate the vehicle on at least one predetermined driving schedule.

3. The method of claim 2, wherein the calculating of the first component of degradation is further based on a temperature of the battery.

4. The method of claim 2, wherein the calculating of the first component of degradation is further based on a depth of discharge of the battery during a respective portion of the at least one predetermined driving schedule.

5. The method of claim 2, wherein the calculating of the first component of degradation is further based on a temperature of the battery and a depth of discharge of the battery during a respective portion of the at least one driving schedule.

6. The method of claim 1, wherein the calculating of the second component of degradation comprises calculating the calendar life of the battery.

7. The method of claim 6, wherein the calculating of the second component of degradation is further based on a temperature of the battery when the battery is not being used to drive the vehicle.

8. The method of claim 6, wherein the calculating of the second component of degradation is further based on a state of charge (SOC) of the battery when the battery is not being used to drive the vehicle.

9. The method of claim 6, wherein the calculating of the second component of degradation further comprises determining a rate of degradation based on results of tests performed on the battery.

10. The method of claim 6, wherein the rate of degradation is further based on the temperature of the battery and the SOC of the battery when the battery is not being used to drive the vehicle, and the calculating of the second component of degradation comprises multiplying the rate of degradation by the amount of time the battery is not being used to drive the vehicle and total useable capacity of the battery based only on the cycling of the battery.

11. The method of claim 1, further comprising calculating a remaining battery capacity based on a difference between the estimated total degradation of the battery and the total useable capacity of the battery, wherein the calculating of the remaining battery capacity is performed by a processing system on-board an automobile.

12. A method for estimating the remaining life of an automotive propulsion battery comprising:
    calculating a total useable capacity of the battery based on cycling of the battery via a processor;
    calculating a first component of degradation based on the driving throughput of the battery via the processor, the calculating of the first component of degradation comprising calculating the driving throughput of the battery used to operate the vehicle on at least one predetermined driving schedule;
    calculating a second component of degradation via the processor based on a calendar life of the battery, the calculating of the second component of degradation comprising determining a rate of degradation based on results of tests performed on the battery;
    estimating the remaining life of the battery beyond a current battery cycle based on the total useable capacity and the first and second components of degradation via the processor; and
    providing an indication of the degradation to a user.

13. The method of claim 12, wherein the calculating of the first component of degradation is further based on a temperature of the battery and a depth of discharge of the battery during a respective portion of the at least one driving schedule.

14. The method of claim 12, wherein the rate of degradation is further based on the temperature of the battery and the SOC of the battery when the battery is not being used to drive the vehicle, and the calculating of the second component of degradation comprises multiplying the rate of degradation by the amount of time the battery is not being used to drive the vehicle and total useable capacity of the battery based only on the cycling of the battery.

15. A non-transitory machine-readable medium having a set of instructions stored thereon that when performed by a machine causes the machine to perform a method, the method comprising:
    calculating a total useable capacity of a battery;
    calculating a first component of degradation based on the driving throughput of the battery;
    calculating a second component of degradation based on a calendar life of the battery;
    estimating a remaining life of the battery beyond a current battery cycle based on the total useable capacity and the first and second components of degradation; and
    providing an indication of the remaining life to a user.

16. The machine-readable medium of claim 15, wherein the calculating of the first component of degradation comprises calculating a the driving throughput of the battery used to operate the vehicle on at least one predetermined driving schedule and wherein the calculating of the first component of degradation is further based on a temperature of the battery and a depth of discharge of the battery during a respective portion of the at least one driving schedule.

17. The machine-readable medium of claim 15, wherein the calculating of the second component of degradation is further based on a temperature of the battery and a state of charge (SOC) of the battery when the battery is not being used to drive the vehicle.

18. The method of claim 1, wherein the step of estimating the remaining life of the battery comprises the step of estimating a number of battery cycles remaining for operation of the battery based on the total usable capacity and the first and second components of degradation via the processor.

19. The method of claim 12, wherein the step of estimating the remaining life of the battery comprises the step of estimating a number of battery cycles remaining for operation of the battery based on the total usable capacity and the first and second components of degradation via the processor.

20. The non-transitory machine-readable medium of claim 15, wherein estimating a remaining life of the battery comprises:
    estimating a number of battery cycles remaining for operation of the battery based on the total usable capacity and the first and second components of degradation.

\* \* \* \* \*